United States Patent
Yuan et al.

(10) Patent No.: US 6,809,910 B1
(45) Date of Patent: Oct. 26, 2004

(54) METHOD AND APPARATUS TO TRIGGER SUPERCONDUCTORS IN CURRENT LIMITING DEVICES

(75) Inventors: Xing Yuan, Albany, NY (US); Drew Willard Hazelton, Selkirk, NY (US); Michael Stephen Walker, Albany, NY (US)

(73) Assignee: SuperPower, Inc.

( * ) Notice: Subject to any disclaimer, the term of this patent is extended or adjusted under 35 U.S.C. 154(b) by 0 days.

(21) Appl. No.: 10/606,467

(22) Filed: Jun. 26, 2003

(51) Int. Cl.[7] .................................................. H02H 7/00
(52) U.S. Cl. ...................... 361/19; 335/216; 505/211; 505/213; 505/850
(58) Field of Search ................... 505/211–213, 850, 505/879; 335/216; 361/19

(56) References Cited

U.S. PATENT DOCUMENTS

| | | | |
|---|---|---|---|
| 5,432,666 A | 7/1995 | Hodge | |
| 6,043,731 A | 3/2000 | McDougall et al. | |
| 6,137,388 A | * 10/2000 | Saravolac | ............... 505/211 |
| 6,275,365 B1 | 8/2001 | Kalsi et al. | |
| 2003/0021074 A1 | 1/2003 | Yuan | |

* cited by examiner

*Primary Examiner*—Ramon M. Barrera
(74) *Attorney, Agent, or Firm*—George L. Rideout, Esq.; Enrique Abarca, Esq.

(57) ABSTRACT

A method and apparatus for magnetically triggering a superconductor in a superconducting fault current limiter to transition from a superconducting state to a resistive state. The triggering is achieved by employing current-carrying trigger coil or foil on either or both the inner diameter and outer diameter of a superconductor. The current-carrying coil or foil generates a magnetic field with sufficient strength and the superconductor is disposed within essentially uniform magnetic field region. For superconductor in a tubular-configured form, an additional magnetic field can be generated by placing current-carrying wire or foil inside the tube and along the center axial line.

15 Claims, 8 Drawing Sheets

METHOD AND APPARATUS TO TRIGGER SUPERCONDUCTORS IN CURRENT LIMITING DEVICES

The U.S. Government has a paid-up license in this invention and the right in limited circumstances to require the patent owner to license others on reasonable terms as provided for by the terms of Contract No. DE-FC36-03G013033 awarded by the Department of Energy.

BACKGROUND

The invention relates generally to a superconducting current limiting device, and more particularly to a superconducting current limiting device that uses magnetic field to achieve transition of superconductor from a superconducting state to a normal resistive state.

Fault current limiting in an AC electric power system can be accomplished by introducing variable impedance of a fault current limiter (FCL) into the power system during a fault to limit the magnitude of the fault current. Superconductors can provide such variable impedance by transitioning from their superconducting state to a normal resistive state where they exhibit ohmic resistive behavior. Superconductors remain in a superconductive state as long as their temperature, current density and magnetic field remain below critical levels, denoted as $T_c$, $J_c$ and $H_c$. This characteristic is graphically illustrated in FIG. 1, where the region between the origin and the critical surface defined by $T_c$, $J_c$ and $H_c$ is the region where the superconducting material enters a superconducting state. Outside of the critical surface, the material becomes non-superconducting and exhibits resistive characteristics.

Because of the high surge current generated during a fault, the current in a current limiting device exceeds the critical current level of its superconducting element causing the material to transition from a superconducting state to a normal resistive state. This transition, referred to as "quenching," is characterized by a nonlinear increase in the effective resistance defined as the voltage across the superconductor element divided by current. It is also known that the addition of magnetic field during this transition results in an additional increase in resistance until the effect saturates out at higher temperatures. One can think of the phenomena as the layering of "iso-resistance" shells that extend outward from the critical $T_c$-$J_c$-$H_c$ surface in FIG. 1 until a saturation resistance is achieved. Therefore, in addition to the resistance that is achieved by current exceeding the critical current level, additional resistance can be achieved with application of a magnetic field to the superconductor.

The quenching of a superconductor to the normal resistive state and subsequent recovery to the superconducting state corresponds to a reversible "variable impedance" effect. A superconducting device with such characteristics is ideal in a current limiting application. Such a device can be designed so that under normal operating conditions the peak operating current level is always below the critical current level of the superconductor elements. As such, effectively no power loss ($I^2R$ loss) will result during normal operation. When the fault condition occurs, however, the fault current level exceeds the critical current level of the superconducting elements, thus causing the device to enter a quench state. By the same token, mechanisms altering the device's operating temperature and/or applied magnetic field level may be adapted as a catalyst to help achieving fast and uniform quenching of such a superconducting device. As long as the superconducting material is not damaged during quench, it can recover back to its superconducting state if the level of the above-mentioned three factors were reduced to within their respective critical level after quench.

U.S. Pat. No. 6,664,875, assigned to the assignee of the present invention, and entitled "Matrix-type Superconducting Fault Current Limiter," herein incorporated by reference, describes a mechanism that combines all three of the quenching factors of a superconductor, namely current, magnetic field and temperature, to achieve more uniform quenching of the superconductor during current limiting. This MFCL uses a magnetic field as one of the triggering mechanisms to force fast and uniform quenching in the superconductor, therefore reducing burnout risks caused by non-uniformity in the superconductor material.

Methods and apparatuses to generate magnetic fields in superconducting current limiting devices, such as the MFCL above that use a magnetic field as one of the means to achieve superconductor quenching, are therefore critical in the operation of such devices. The applied magnetic field, referred herein as trigger magnetic field, should be generated with sufficient strength to cause quenching with a high degree of magnetic field uniformity. The compactness of the apparatus that generates such magnetic field should also he a major design consideration in order to reduce the overall size of a current limiting device. Generating a uniform trigger magnetic field is desirable since uniform quenching of a superconductor can significantly reduce the impact of "hot spots" (local regions of non-uniformity that may cause local heating or burn out during quench) on the thermal stability and reliability of the superconductor components.

BRIEF DESCRIPTION

Briefly, in accordance with one embodiment of the present invention, a tubular-configured superconductor element is arranged within a concentric outer coil to generate a magnetic field during current limiting. This tubular-configured superconductor has an axial length that is a single straight tube, a bifilar coil arranged in a tubular form, or multiple pieces of superconductor in low or non-inductive forms (tube, bar, rod, tape, etc.) electrically connected in series or in parallel and arranged in a tubular configuration. The outer coil has a fixed number of turns disposed closely adjacent to the outside diameter of the superconductor, which extend beyond the ends of the superconductor. The superconductor is situated within the outer coil in such a manner and the extension of the coil over the ends of the superconductor such that the magnetic field vector generated by the current flowing through the coil is oriented parallel to the length of the superconductor. A foil may replace the outer coil and is disposed around the superconductor in the same manner as the outer coil. In addition, a foil or a long wire carrying current that generates additional magnetic fields may be disposed inside the tubular-configured superconductor. The foil is disposed concentrically with the tubular-configured superconductor, while the wire is disposed along the center axial line of the tubular-configured superconductor. The length of the foil or the wire extends beyond the ends of the superconductor such that the magnetic field vector generated by the current in the foil or wire is tangent to the circumference of the superconductor and is perpendicular to the length of the superconductor, concurrently.

In an alternative embodiment of the present invention, a rod-type superconductor element is disposed inside a trigger coil that generates a uniform magnetic field during current limiting. The trigger coil has a fixed number of turns disposed closely adjacent the outer diameter of the superconductor, and the coil extends beyond the ends of the superconductor. The trigger coil is disposed along the superconductor in such a manner, and the extension of the coil over the ends of the superconductor such that the magnetic field vector generated by the current flows through this coil along the superconductor length and is oriented parallel to the current that flows through the superconductor. Such an arrangement is also applicable to superconductors having other low or non-inductive configurations.

In a further alternative embodiment of the present invention a method is provided for generating a uniform magnetic field applied to a no or low-inductance superconductor. The method consists of generating a uniform magnetic field by axially disposing a current-carrying coil on the outside of the superconductor, and by extending the length of the coil to beyond the ends of the superconductor. The coil is arranged such that the inner length extends beyond the ends of the superconductor such that the magnetic field vector generated by the coil is oriented parallel to the length of the superconductor. The coil may be replaced by a foil. In this case, the magnetic field vector is oriented perpendicular to the length of the superconductor. The method further consists of generating an additional uniform magnetic field by axially disposing a current-carrying foil or wire inside the tubular-configured superconductor having a low-inductance. The length of the foil extends beyond the ends of the superconductor such that the magnetic field vector generated by the current in the foil along the inner surface of the superconductor is tangent to the circumference of the superconductor and is perpendicular to the length of the superconductor, concurrently.

DRAWINGS

These and other features, aspects, and advantages of the present invention will be better understood when the following detailed description is read with reference to the accompanying drawings in which like characters represent like parts throughout the drawings, wherein.

Figure 6A:
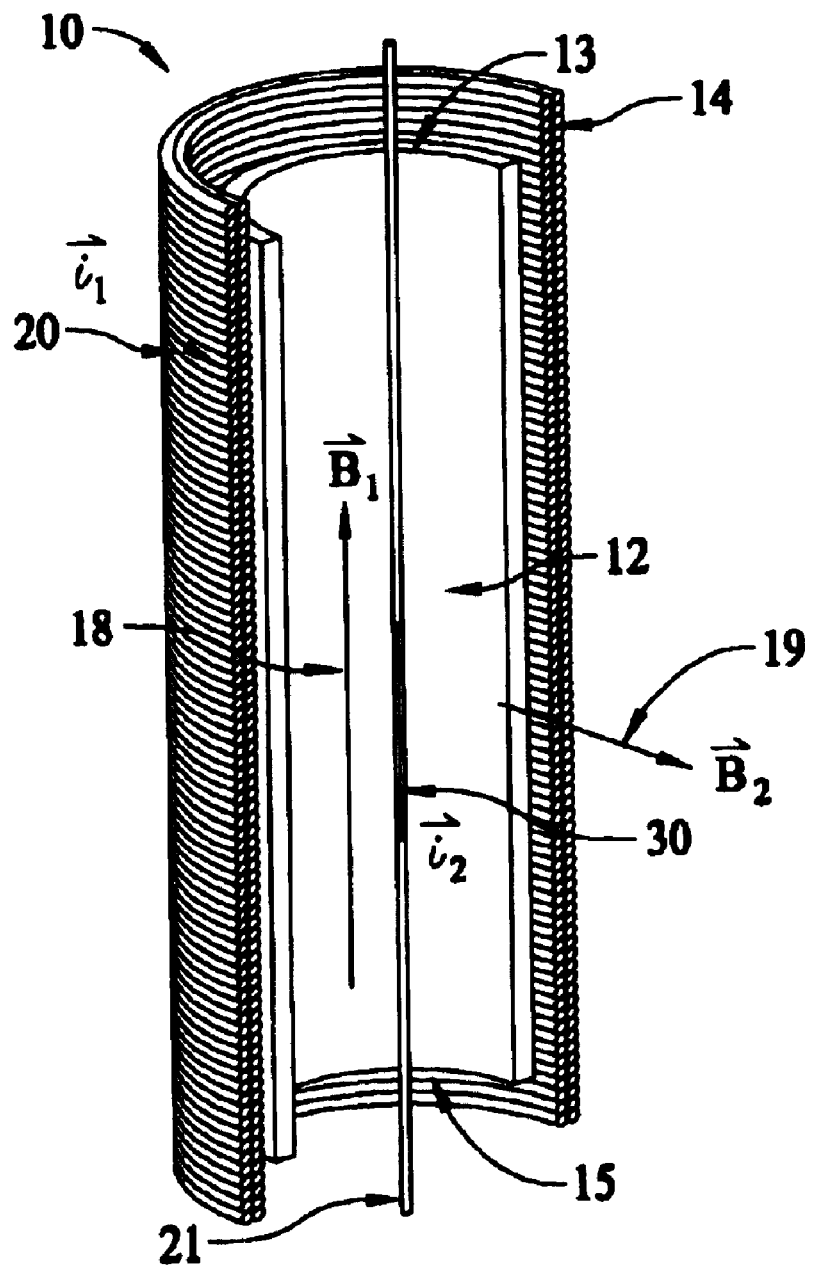

FIG. 6a shows a tubular-configured superconductor in a uniform magnetic field region generated by a current-carrying outer coil. The magnetic field vector is parallel to the current in the superconductor along the superconductor length. A current-carrying wire is disposed along the center axial line of the tubular-configured superconductor. The additional magnetic field vector generated by this wire is tangent to the circumference of the superconductor and is perpendicular to the length of the superconductor.

Figure 6B:
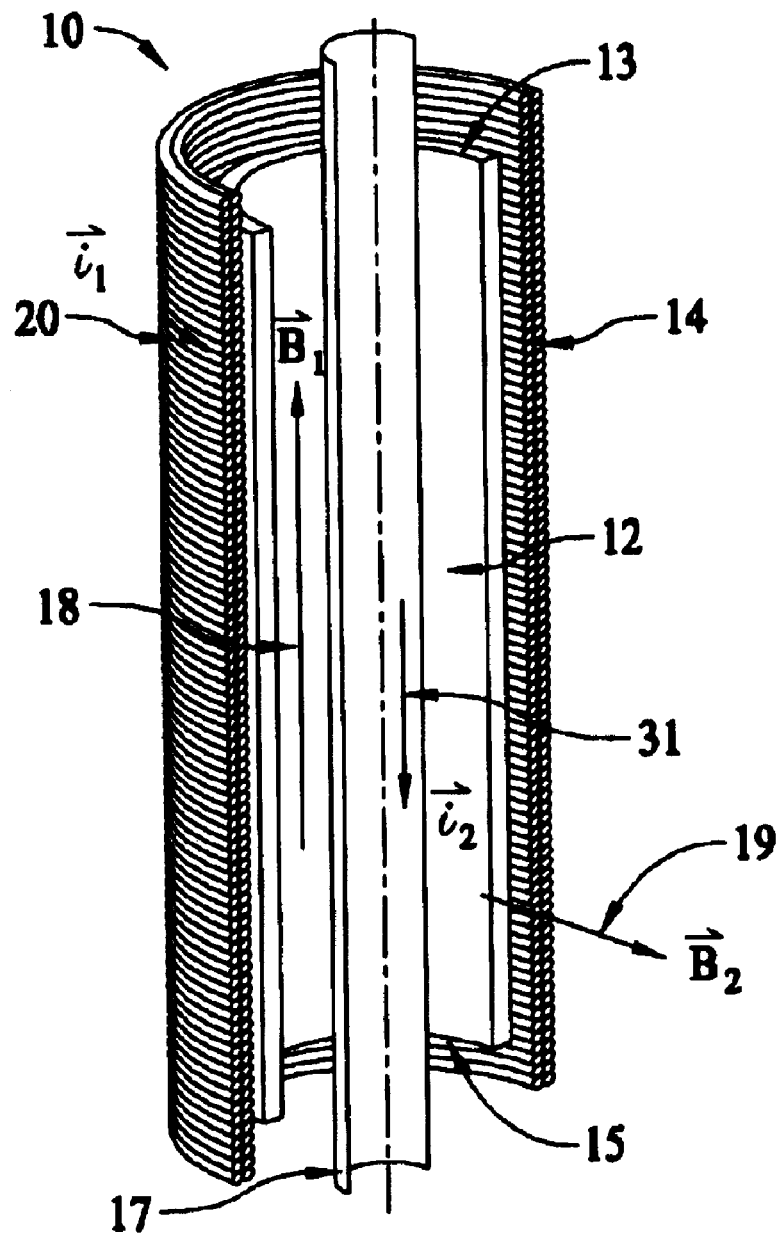

FIG. 6b shows a tubular-configured superconductor in a uniform magnetic field region generated by a current-carrying outer coil. The magnetic field vector is parallel to the current in the superconductor along the superconductor length. A current-carrying foil is disposed concentrically within the inner diameter of the tubular-configured superconductor. The additional magnetic field vector generated by this foil is tangent to the circumference of the superconductor and is perpendicular to the length of the superconductor.

DETAILED DESCRIPTION

Figure 2A:
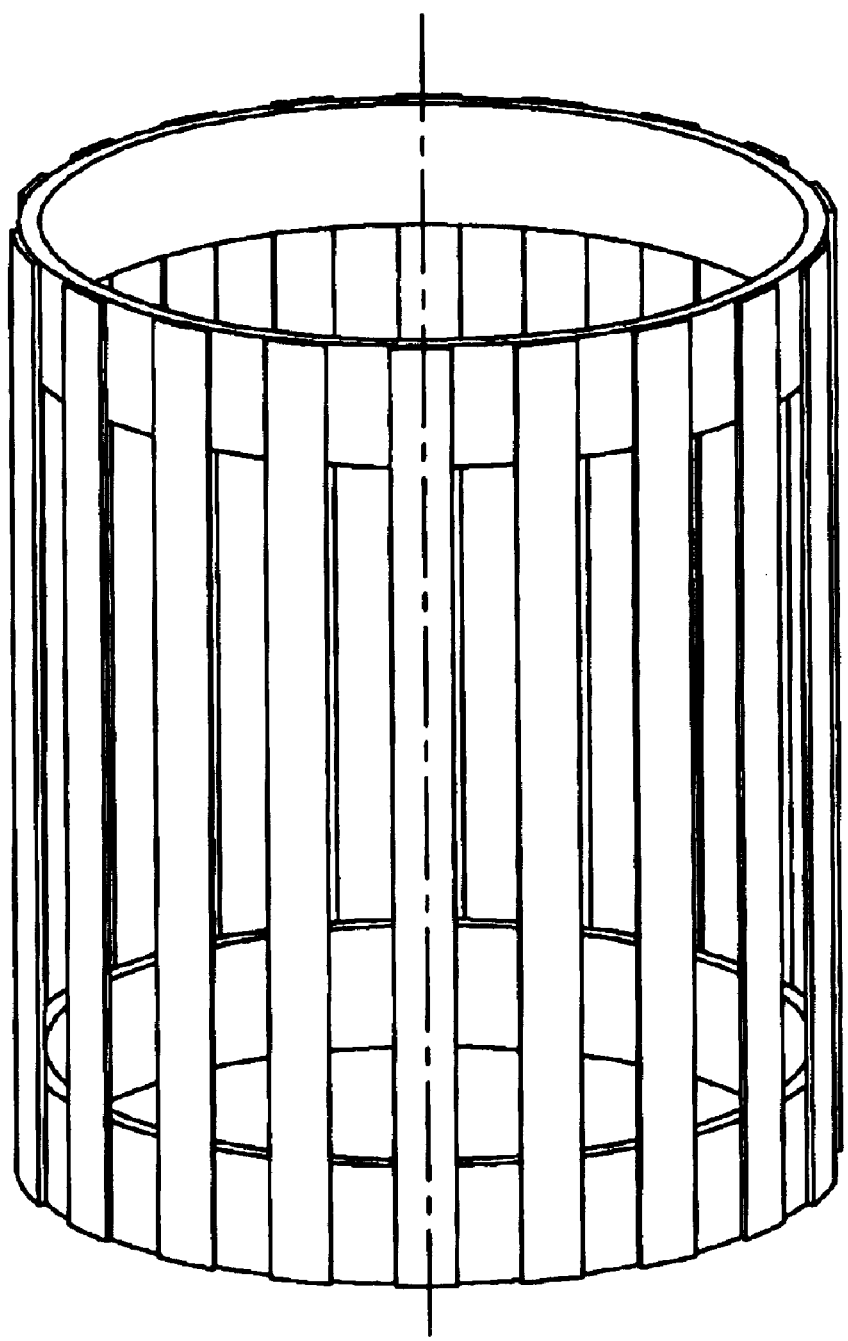
FIG. 2a shows a schematic representation of a tubular-configured superconductor element formed by multiple superconductor tapes electrically connected in parallel and arranged in tubular form.
Figure 2B:
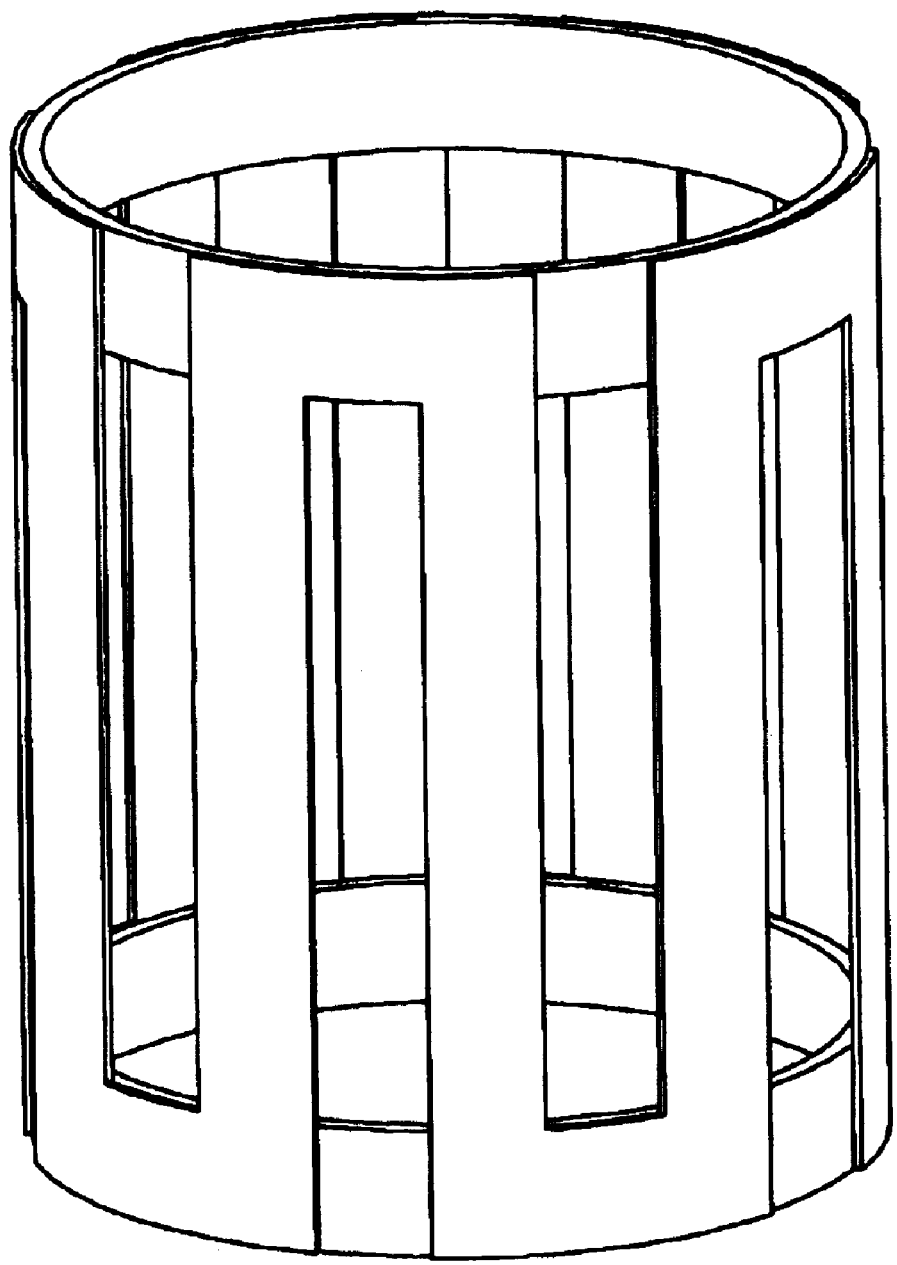
FIG. 2b shows a schematic representation of a tubular-configured superconductor element formed by multiple superconductor tapes electrically connected in series and arranged in tubular form.

The present invention generally provides an apparatus for magnetically triggering a superconducting element in a fault current limiter (FCL) by arranging a triggering mechanism such as a current-carrying coil, foil or wire on either or both the inner diameter and outer diameter of the superconductor element in non or low-inductance configurations such as rod, bar, plate, strip or tubular-configured forms etc. In addition to a single straight tube, FIG. 2 provides two examples of "tubular-configured" superconductor elements. In FIG. 2a, multiple superconducting tapes are arranged in parallel in a tubular configuration. The top ends of all the tapes are electrically connected. The bottom ends of all the tapes are also electrically connected. The current flows from one end of the "tube" to the other. FIG. 2b shows a similar arrangement of multiple tapes physically in parallel with each other in a tubular form. However, the electrical connection of the tapes is such that all the tapes are connected in series. An example of a current-carrying trigger coil made of electrically conductive material applying uniform magnetic field to a tubular-configured superconductor is provided. An exemplary embodiment includes a superconductor tubular element having an inner diameter of 50 mm and outer diameter of 70 mm and a length of 200 mm. The outer trigger coil consists of 1200 turns of 1 mm diameter insulated conductor for a total length of 240 mm wound in 5 layers on a inner diameter of 72 mm giving an outer diameter of 82 mm. The coil and the superconductor tubular element are arranged concentrically. The coil is also positioned over the superconductor element such that 20 mm of the windings extend beyond each end of the superconductor. The uniformity of the magnetic field generated by the superconductor in this case is within ±10%.

Superconductors are used in current limiting devices to provide a current path under normal operation conditions. As long as the critical current level of the superconductor is below the peak of the normal operating AC current level of the power grid (plus any over-current capability required), the current will flow through the path provided by the superconductor since it exhibits no or near-zero electrical resistance. Superconductors having low or non-inductive configurations, for example, of the group consisting of tubes, rods, bars, plates, flat tapes, bifilar coils, are used so there is little or no voltage drop across the terminals of the current limiting device. A substantial voltage drop across such a current limiting device could have negative impact on the power system stability and cause other adverse effects.

Figure 1:
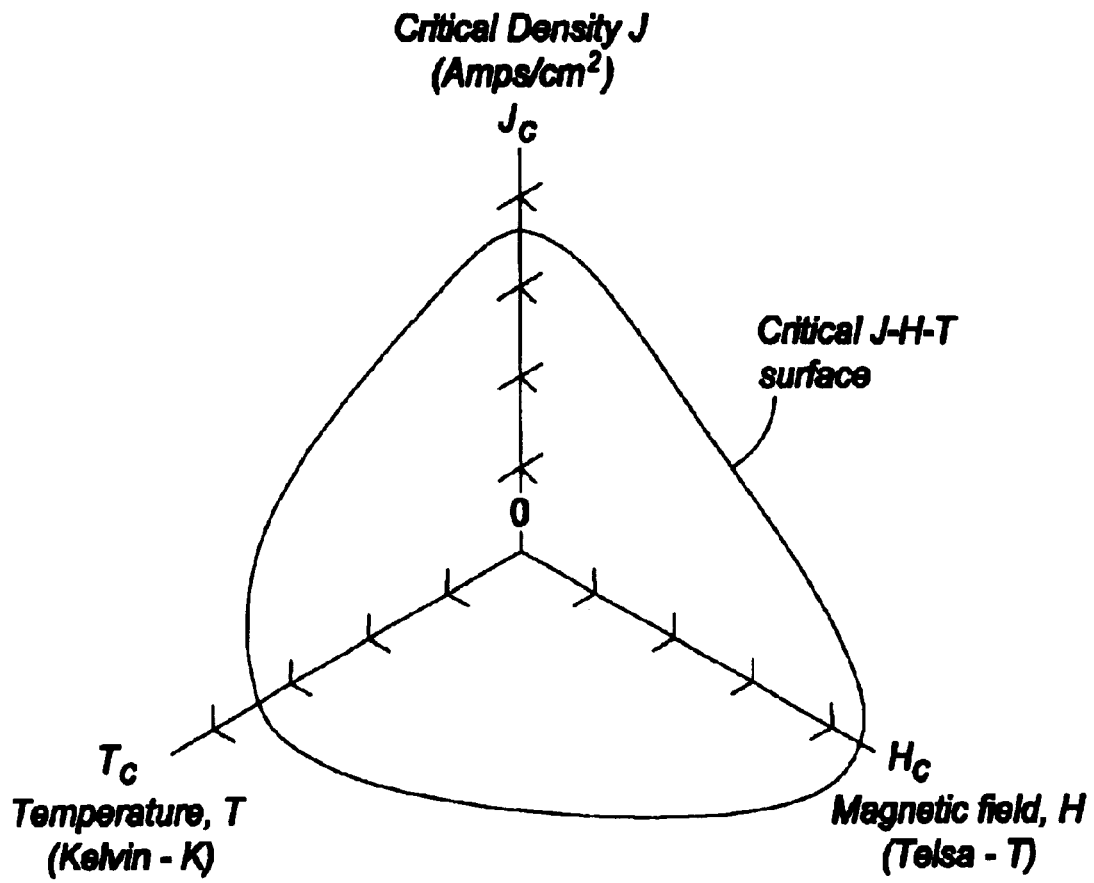
FIG. 1 shows the inter-dependency of critical current level, critical temperature and critical magnetic field of typical superconductor material and the critical J (current density)-H (magnetic field)-T (temperature) surface that borders the superconducting and non-superconducting operating parameters of typical superconductor material.
Figure 3:
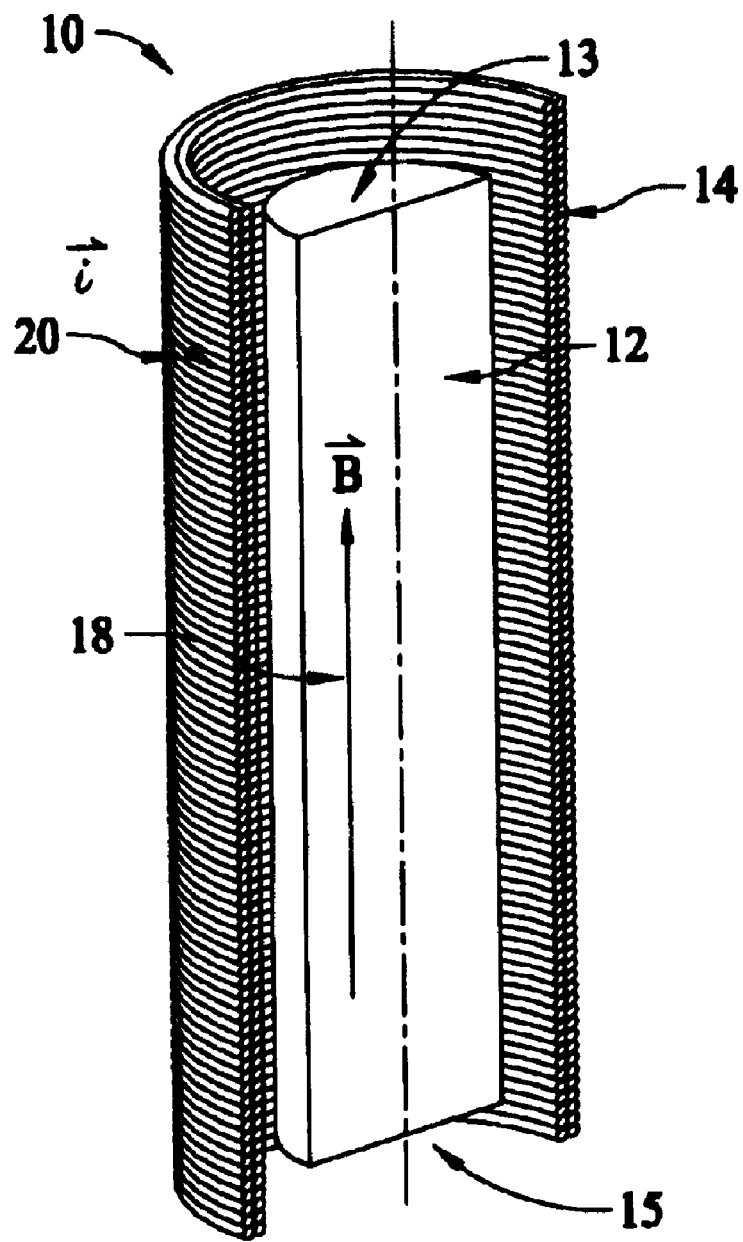
FIG. 3 shows a rod-type superconductor in a uniform magnetic field region generated by a current-carrying outer coil. The magnetic field vector is parallel to the current in the superconductor along the superconductor length.
Figure 4:
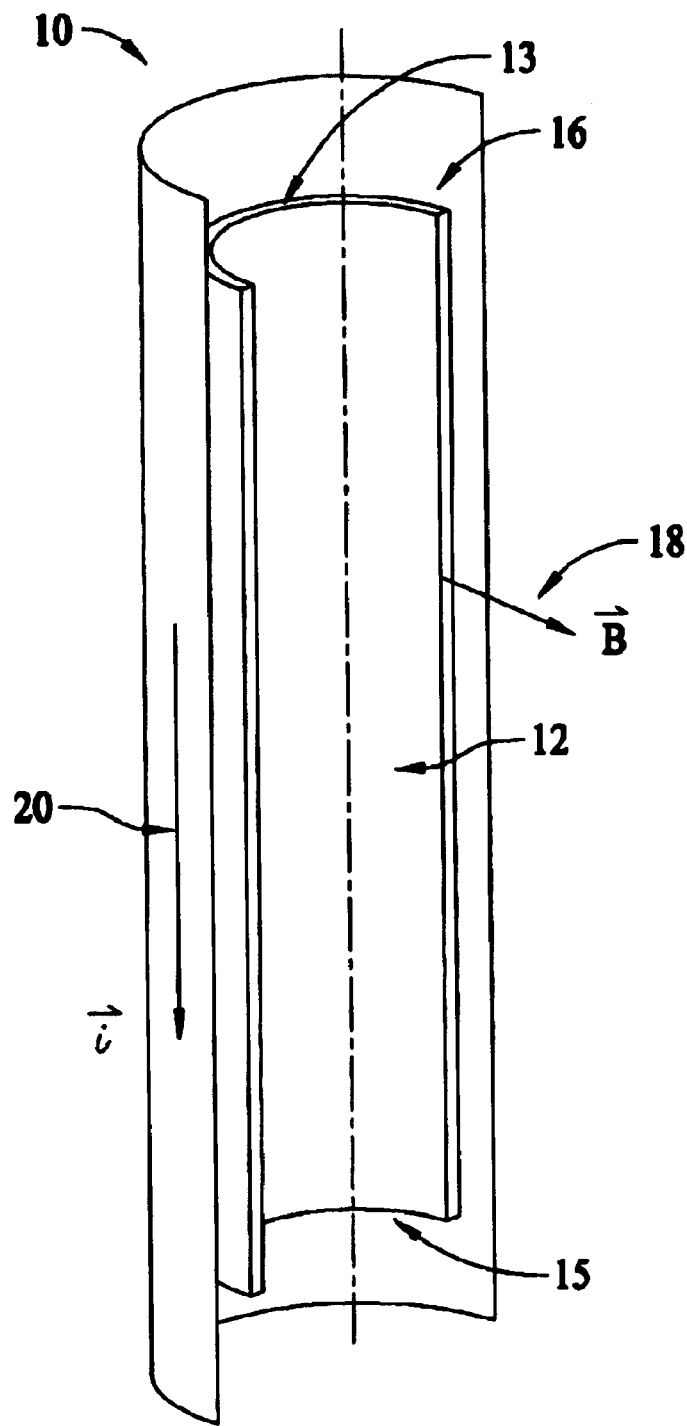
FIG. 4 shows a tubular-configured superconductor in a uniform magnetic field region generated by a current-carrying outer foil. The magnetic field vector is tangent to the circumference of the superconductor and is perpendicular to the current in the superconductor along the superconductor length.

The present invention as illustrated in FIG. 3, is a FCL component 10 which comprises a superconductor element 12 in rod-form with an axial length, a first end 13 and a second end 15, and an outer coil 14. Superconductor element 12 can be made of high temperature superconductive material, such as BSCCO or YBCO. The coil is also referred to as a trigger coil because it acts to help transition the superconductor 12 into the "quenched" region identified by the critical J-H-T surface of FIG. 1. The outer coil 14 is disposed closely adjacent the outer diameter of the superconductor 12. There also may be intervening layers associated with the mechanical support and thermal management of the superconductor 10 and its corresponding trigger coil 14, but these are typically constructed of materials effectively transparent to the magnetic field and are not a factor in the operation of the outer coil 14 on the superconducting element 12. The outer coil 14 envelopes the superconductor and its length extends beyond the ends of the superconductor element 12 so that the superconductor 12 is situated within the near uniform region of the magnetic fields 18 generated by the coil. When current 20 flows through the trigger coil 14 the magnetic field vector 18 generated by the trigger coil 14 is oriented parallel to the current that flows through the superconductor 12. It is understood that the outer coil 14 may also be constructed of a foil comprising a solid electrically conductive material, arranged concentrically around the superconductor element 12 in the same manner as the respective coil but not having any windings. FIG. 4 shows such a current-carrying foil 16 disposed concentrically around a tubular-configured superconductor 12.

Figure 5:
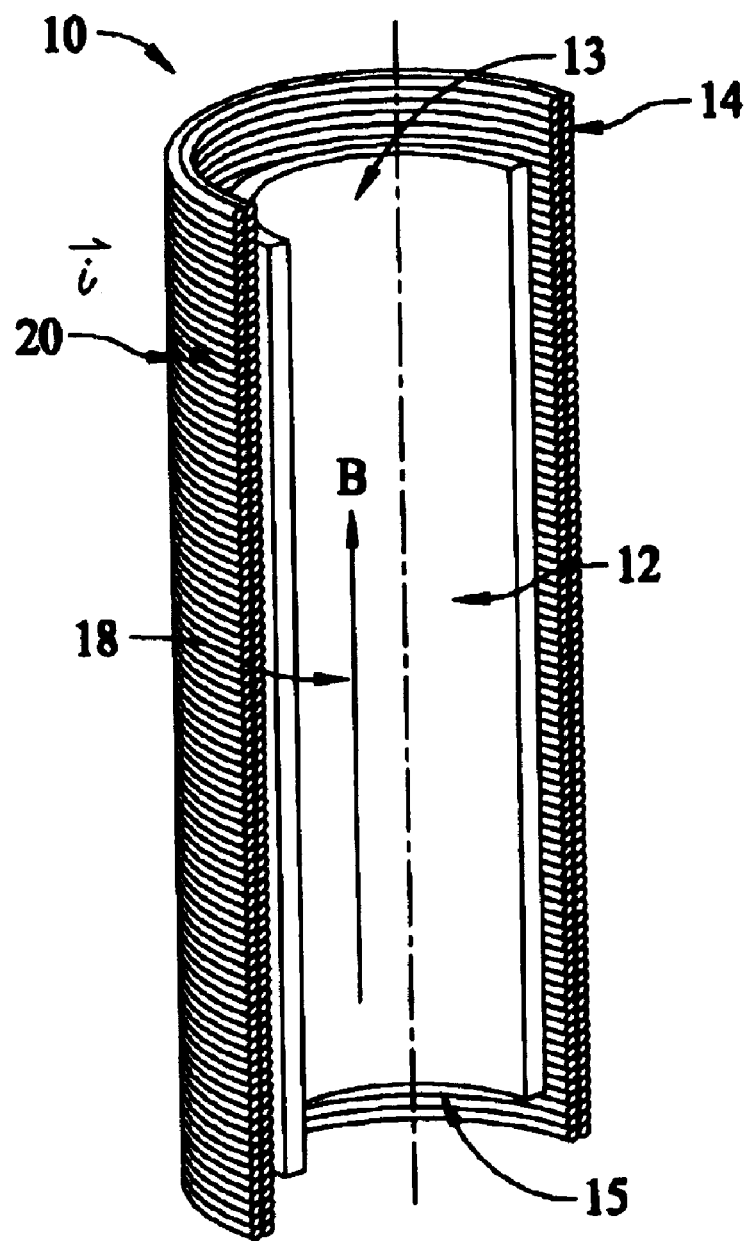
FIG. 5 shows a tubular-configured superconductor in a uniform magnetic field region generated by a current-carrying outer coil. The magnetic field vector is parallel to the current in the superconductor along the superconductor length.

In an alternative embodiment of the present invention, as illustrated in FIG. 5, a FCL component 10 comprises a tubular-configured superconductor element 12 with an axial length, and a trigger magnetic field generating mechanism represented by a current-carrying coil 14 made of electrically conductive material. The trigger coil 14 is disposed nominally concentric around the superconductor 12, and is sufficiently longer than superconductor 12, to ensure that only an essentially uniform and axially oriented magnetic field is generated by the current 20 in the outer trigger coil 14 and applied to the superconductor 12.

Alternative embodiments of the present invention are illustrated in FIGS. 6a and 6b. In FIG. 6a, an additional current carrying wire 21 is introduced into FCL component 10 and is disposed along the center axial line of the tubular-configured superconductor 12. The length of the wire is extended beyond the ends 13 and 15 of the superconductor 12 in such a degree that an additional magnetic field vector 19 generated by the current 30 in the wire is tangent to the circumference of the tubular-configured superconductor 12 and is perpendicular to the length of the superconductor 12. FIG. 6b shows a similar arrangement as FIG. 6a, with the current-carrying wire 21 replaced by a current-carrying foil 17 concentrically disposed inside the tubular-configured superconductor 12. The length of the foil 17 extends beyond the ends 13 and 15 of the superconductor 12 in such a degree that the additional magnetic field vector 19 generated by the current 31 in the foil is tangent to the circumference of the tubular-configured superconductor 12 and is perpendicular to the length of the superconductor 12.

The previously described embodiments of the present invention have at least the advantage of improved trigger magnetic field uniformity. Consequence, the improved uniformity of the trigger magnetic field across the superconductor enhances its uniformity and homogeneity of the transition from a superconducting state to a normal resistive state, and minimizes the impact of any non-uniformity existed within the superconductor 12.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A superconducting fault current limiter (FCL) component having a superconductor in a non or low-inductive configuration with an axial length, a first end and a second end, the FCL component comprising:

a current-carrying coil made of electrically conductive material having a predetermined number of turns disposed closely adjacent the outer diameter of the superconductor, the coil enclosing the superconductor and extending beyond the first end and extending beyond the second end of the superconductor;

wherein the superconductor element is centered along the center axial line of the current-carrying coil; and wherein the current-carrying coil is electrically coupled in series and in parallel with the superconductor, and is adapted to generate a trigger magnetic field with sufficient strength to cause the superconductor to transition from a superconducting state to a normal resistive state during current limiting.

2. The FCL component as recited in claim 1, wherein the FCL is a superconducting MFCL.

3. The FCL component as recited in claim 1, wherein the superconductor is made of high-temperature superconducting material.

4. The FCL component as recited in claim 3, wherein the high-temperature superconducting material is BSCCO.

5. The FCL component as recited in claim 3, wherein the high-temperature superconducting material is YBCO.

6. The FCL component as recited in claim 1, wherein the trigger magnetic field generated by the the current-carrying coil is essentially uniform within the region of the superconductor.

7. The FCL component as recited in claim 6, wherein the trigger magnetic field generated by the the current-carrying coil has a uniformity of within ±10% within the superconductor region.

8. The FCL component as recited in claim 1, wherein the superconductor is selected from the group consisting of a tube, rod, bar, plate, straight tape, straight wire, bifilar coil.

9. The FCL component as recited in claim 1, wherein the superconductor is a non or low-inductive configuration of a tubular-configured high temperature superconductor.

10. The FCL component as recited in claim 9, wherein the tubular-configured superconductor is at least one non or low-inductive superconductor, the superconductor selected from the group consisting of a tube, rod, bar, plate, straight tape, straight wire and bifilar coil.

11. The FCL component as recited in claim 1, wherein said current-carrying coil made of electrically conductive material having a predetermined number of turns is a foil made of electrically conductive material.

12. The FCL component as recited in claim 1, wherein the trigger coil is a solenoid.

13. A method of generating an essentially uniform trigger magnetic field in a fault current limiter having a low inductance superconductor, and having a magnetic field region, and having an outer coil axially disposed outside the superconductor, the method comprising the steps of:

generating a magnetic field from the trigger coil, wherein the magnetic field has sufficient strength to trigger the transition of the superconductor from a superconducting state to a normal resistive state, wherein the superconductor is enveloped by the magnetic field region; and generating an additional magnetic field for a tubular-configured superconductor by a current-carrying wire or foil being disposed inside the inner diameter and along the center axial line of the superconductor, wherein the current carrying wire or foil has length extending beyond the ends of the superconductor;

wherein the trigger coil extends beyond the ends of the superconductor and wherein the superconductor is disposed along a center axial line of the trigger coil such that the superconductor is situated in the region where magnetic field generated by the trigger coil is essentially uniform.

14. A superconducting fault current limiter (FCL) component having a tubular configured superconductor in a non or low-inductive configuration with an axial length, a first end and a second end, the FCL component comprising:

a current-carrying coil made of electrically conductive material having a predetermined number of turns disposed closely adjacent the outer diameter of the superconductor, the coil enclosing the superconductor and extending beyond the first end and extending beyond the second end of the superconductor;

a second current-carrying wire disposed along the center axial line of the tubular-configured superconductor is adapted to generate an additional magnetic field;

wherein the superconductor is centered along the center axial line of the current-carrying coil; and wherein the current-carrying coil is adapted to generate a trigger magnetic field with sufficient strength to cause the superconductor to transition from a superconducting state to a normal resistive state during current limiting.

15. The FCL component as recited in claim 14, wherein an additional magnetic field is generated by a current-carrying foil disposed along the center axial line and concentric with the tubular-configured superconductor.

* * * * *